United States Patent [19]

Okamoto

[11] Patent Number: 4,661,779
[45] Date of Patent: Apr. 28, 1987

[54] OPERATIONAL AMPLIFIER

[75] Inventor: Toshiyuki Okamoto, Tokyo, Japan

[73] Assignee: Nec Corporation, Tokyo, Japan

[21] Appl. No.: 807,905

[22] Filed: Dec. 11, 1985

[30] Foreign Application Priority Data

Dec. 11, 1984 [JP] Japan .................................. 59-261283

[51] Int. Cl.[4] ............................................. H03F 3/45
[52] U.S. Cl. .................................. 330/253; 330/257; 330/260; 330/311
[58] Field of Search ............... 330/107, 109, 253, 257, 330/260, 294, 311

[56] References Cited

U.S. PATENT DOCUMENTS 4,484,148  11/1984  Wieser ................................. 330/253

Primary Examiner—James B. Mullins
Attorney, Agent, or Firm—Sughrue, Mion, Zinn, Macpeak & Seas

[57] ABSTRACT

An operational amplifier comprises an initial amplifier stage having a pair of inputs, and a second amplifier stage connected to an output of the initial stage. A phase compensating capacitive element is connected between an output terminal of the second stage and a virtual ground point, and a constant current source is connected to the virtual ground point and the output of the initial stage. A resistive element and a capacitive element are series-connected between the output of the initial stage and the output of the second stage.

22 Claims, 10 Drawing Figures

4,661,779

OPERATIONAL AMPLIFIER

BACKGROUND OF THE INVENTION

1. Field of the Invention

The present invention relates to operational amplifiers, and more specifically to operational amplifiers having a phase compensating circuit.

2. Description of Related Art

At present, operational amplifiers are widely used in various fields, particularly as one important element in analog circuits. Ordinarily, the operational amplifier fundamentally comprises two amplifier stages, i.e., an initial amplifier stage having an inverted input and a non-inverted input, and an output amplifier stage having an input connected to an output of the initial stage. This output stage ordinarily includes a capacitive feedback circuit between the output and the input of the output stage. However, in the case that the feedback path is established by only a simple capacitive electrical part, the gain of the operational amplifier does not sufficiently drop at a higher frequency region. This will often give rise to a problem of null or zero points, which lead to a cause for oscillation of the operational amplifier.

In order to avoid such an adverse effect of the zero points, various types of zero point compensating circuits have heretofore been proposed. However, almost the conventional zero point compensating circuits will make worse the supply voltage rejection ratio (abbreviated "SVRR" hereinafter) of the operational amplifier.

Among such conventional amplifiers having the zero point compensating circuits, one amplifier has succeeded not only in enabling the zero-point compensation but also in improving the SVRR, by forming the feedback circuit by series-connected capacitor and active load. In this amplifier, however, the active load is required to have a large transconductance, which will result in increase of power comsumption or increase in the element dimensions necessary for the active load, leading to increase in the integrated circuit chip size.

SUMMARY OF THE INVENTION

Accordingly, it is an object of the present invention to provide an operational amplifier which is free from the above mentioned drawbacks in the conventional aamplifiers.

Another object of the present invention is to provide an operational amplifier associated with a phase compensating circuit having an excellent zero point compensating characteristics and an improved supply voltage rejection ratio.

Still another object of the present invention is to provide such an operational amplifier having a small power comsuption and a small required chip area.

The above and other objects of the present invention are achieved by an operational amplifier which comprises an initial amplifying stage having a pair of inputs, a second amplifying stage connected to an output of the initial stage, a phase compensating feedback capacitive element connected between an output terminal of the second amplifying stage and a virtual ground point, and a constant current source connected to the virtual ground point and the output of the initial stage. In accordance with the present invention, a resistive element and a second capacitive element are series-connected between the output of the initial stage and the output of the second stage.

The above and other objects, features and advantages of the present invention will be apparent from the following description of preferred embodiments of the invention with reference to the accompanying drawings.

DESCRIPTION OF THE PREFERRED EMBODIMENTS

Figure 1:
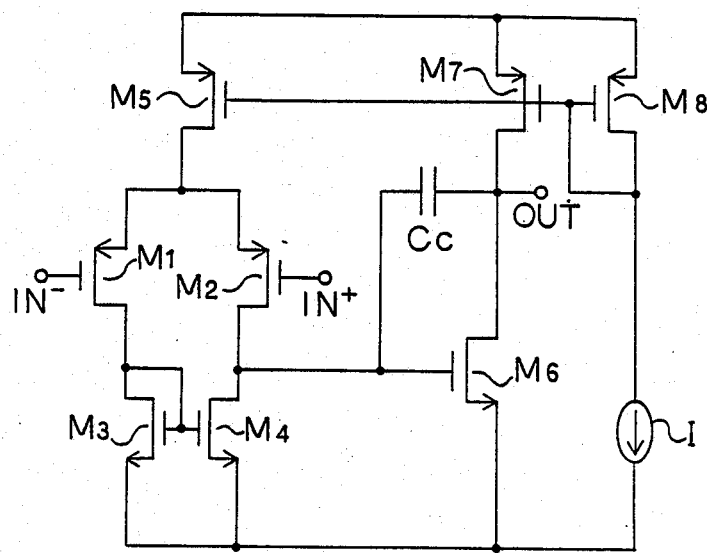
FIG. 1 is a circuit diagram showing one conventional operational amplifier.

Referring to FIG. 1, there is shown a circuit diagram of a typical operational amplifier, which includes an initial stage constituted of a pair of input field effect transistors (abbreviated "FET" hereinafter) $M_1$ and $M_2$ connected to form a differential circuit. Therefore, a gate of the FET $M_1$ provides one input, for example, an inverted input of the operational amplifier, and a gate of the other FET $M_2$ functions the other input, for example, a non-inverted input of the amplifier. The pair of input FETs $M_1$ and $M_2$ have their drains respectively connected to a negative supply voltage through another pair of FETs $M_3$ and $M_4$ arranged to form an active load in the type of a current mirror circuit. Therefore, the FET $M_2$ forms a drain follower. Sources of the FETs $M_1$ an $M_2$ are common-connected to a drain of an FET $M_5$ whose source is connected to a positive supply voltage.

The drain of the FET $M_2$ is connected to a gate of an output FET $M_6$ which constitutes a second or output stage of the operational amplifier. This FET $M_6$ is connected at its source to the negative supply voltage and at its drain to the positive supply voltage through an FET $M_7$. In addition, the drain of the FET $M_6$ is connected through a phase compensating feedback capacitor $C_c$ to the gate of the FET $M_6$ itself, and forms an output of the operational amplifier.

Gates of the FETs $M_5$ and $M_7$ are connected to a gate and a drain of an FET $M_8$ so as to form a current mirror circuit. The drain of the FET $M_8$ is connected to a constant current source I, so that the current flowing through the FET $M_8$ is defined by the constant current source I, and further, the respective currents flowing through the FETs $M_5$ and $M_7$ are controlled by the FET $M_8$.

Figure 2:
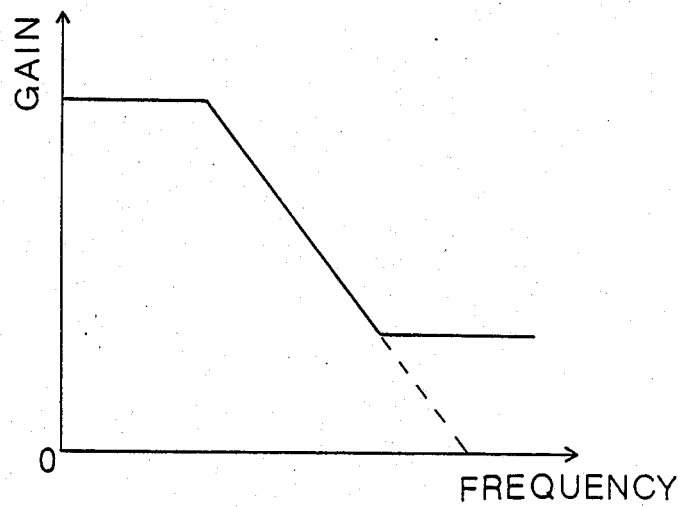
FIG. 2 is a graph showing the relation between the gain and frequency in the conventional operational amplifier shown in FIG. 1.

Reviewing the above mentioned operational amplifier, it has the frequency characteristics as shown in FIG. 2. Namely, the gain does not drop at a high frequency, and therefore, an adverse effect of zero points often becomes a problem. For example, one adverse effect of zero points is to cause an oscillation of the operational amplifier.

Under the circumstances, there have been proposed various compensating circuits capable of eliminating the adverse effects of the zero point. However, almost the conventional zero point compensating circuits have rather adversely increased the SVRR.

Figure 3:
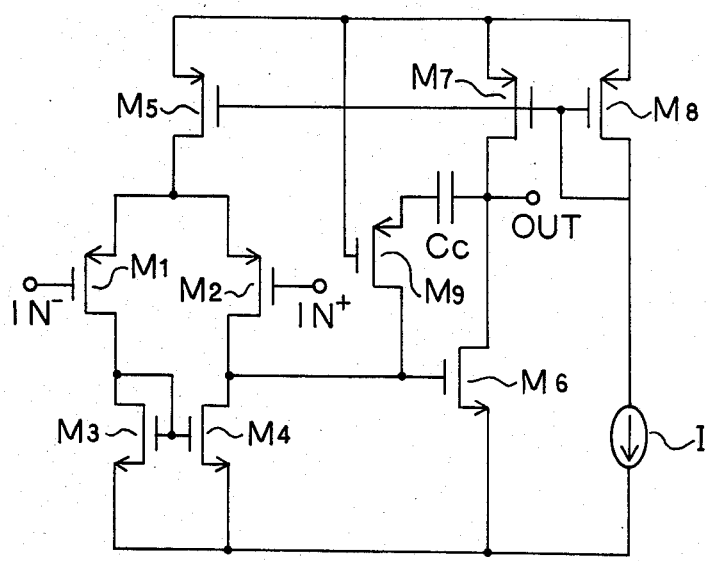
FIG. 3 is a view similar to FIG. 1 but showing another conventional operational amplifier.

One typical example of such conventional zero point compensating circuits will be now explained with reference to FIG. 3, showing a circuit diagram of a typical operational amplifier provided with such a zero point compensating means. In FIG. 3, circuit elements similar to those shown in FIG. 1 are given the same Reference Signs, and explanation will be omitted.

As seen from comparison between FIGS. 1 and 3, the operational amplifier shown in FIG. 3 comprises an FET $M_9$ connected between the gate of the output FET $M_6$ and the phase compensating feedback capacitor $C_c$. The FET $M_9$ has a gate connected to the positive supply voltage, so that the capacitor $C_c$ and the conductive resistance of the FET $M_9$ are series-connected to form a feedback loop which constitutes a zero point compensating circuit.

However, as mentioned above, since the gate of the FET $M_9$ is connected to the positive supply voltage, flactuation in the positive supply voltage will directly lead to variation in the gate-source voltage of the output FET $M_6$, which results in change of the output voltage. Namely, the SVRR is adversely increased.

Figure 4:
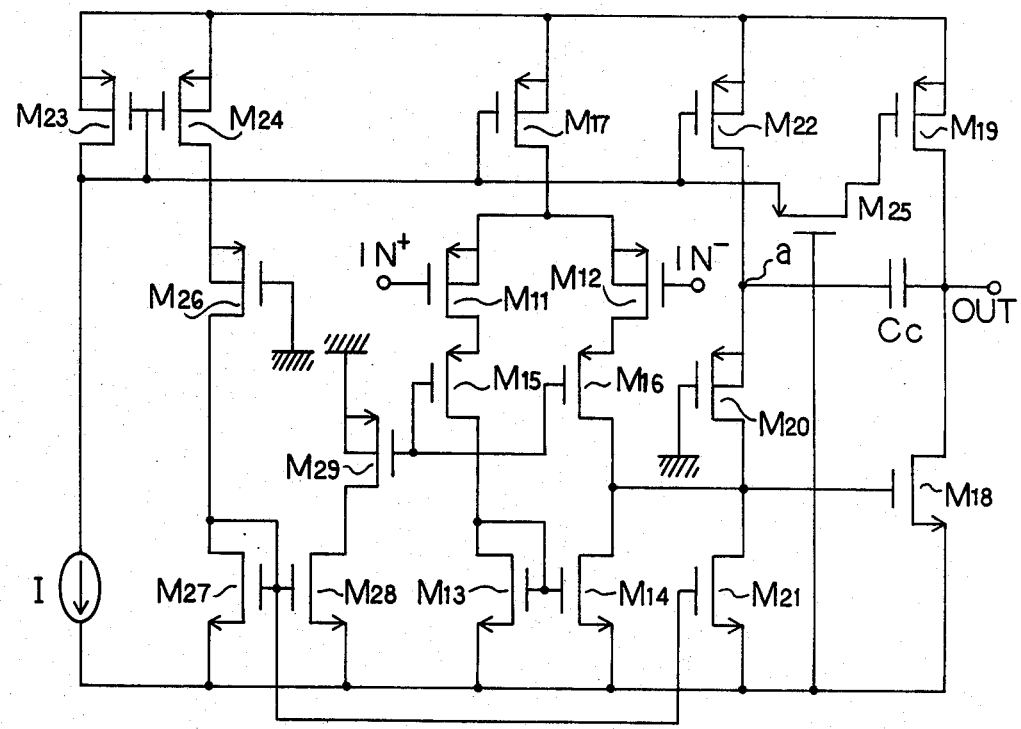
FIG. 4 is a view similar to FIG. 1 but showing still another conventional amplifier.

Thus, in order to enable the zero point compensation and at the same time to improve the SVRR, one operational amplifier has been disclosed by B. K. Ahuja, "An Improved Frequency Compensation Technique for CMOS Operational Amplifiers" IEEE J. Solid-Stage Circuits, 1983 vol. sc-18, No. 6, pp 629–633. FIG. 4 shows a circuit diagram of the operational amplifier.

This operational amplifier comprises includes an initial stage constituted of a pair of input FETs $M_{11}$ and $M_{12}$ connected in the form of a differential circuit. A gate of the FET $M_{11}$ is connected to one input, for example, a non-inverted input of the operational amplifier, and a gate of the other FET $M_{12}$ is connected to the other input, for example, an inverted input of the amplifier. The pair of input FETs $M_{11}$ and $M_{12}$ have their drains respectively connected through FETs $M_{15}$ and $M_{16}$ to another pair of FETs $M_{13}$ and $M_{14}$ arranged to form an active load in the type of a current mirror circuit. Sources of the FETs $M_{11}$ and $M_{12}$ are common-connected to a drain of an FET $M_{17}$ whose source is connected to a positive supply voltage. Thus, the FET $M_{12}$ forms a drain follower, and the connection between the FETs $M_{14}$ and $M_{16}$ is connected to a gate of an output FET $M_{18}$ which constitutes a second or output stage of the operational amplifier.

This FET $M_{18}$ is connected at its source to a negative supply voltage and at its drain to the positive supply voltage through an FET $M_{19}$ which functions as an active load. In addition, the drain of the FET $M_{18}$ is connected to an output of the operational amplifier, and also connected through a phase compensation feedback capacitor $C_c$ to a source of a gate-grounded FET $M_{20}$. This FET $M_{20}$ is connected at its drain to the gate of the FET $M_{18}$ and a drain of an FET $M_{21}$ whose source is connected to the negative supply voltage. Further, the source of the FET $M_{20}$ is connected through an FET $M_{22}$ to the positive supply voltage.

A constant current source I and an FET $M_{23}$ are connected in series across the supply voltages. The FET $M_{23}$ has a gate thereof connected to the drain of FET $M_{23}$ itself and also connected to gates of an FET $M_{24}$, the FET $M_{17}$ and the FET $M_{22}$, so that the FET $M_{23}$ constitutes an input path of a current mirror circuit and the FETs $M_{24}$, $M_{17}$ and $M_{22}$ form different output paths of the current mirror circuit, respectively. Further, the gate of the FET $M_{23}$ is connected to a gate of the FET $M_{19}$ through an FET $M_{25}$ having a gate connected to the negative supply voltage. In addition, the FET $M_{24}$ has a drain thereof connected through a gate-grounded FET $M_{26}$ to a gate and a drain of an FET $M_{27}$, whose source is connected to the negative supply voltage. This FET $M_{27}$ has its gate connected to gates of an FET $M_{28}$ and the FET $M_{21}$ so as to form a current mirror circuit having two output paths. The FET $M_{28}$ is connected at its drain to a source of a drain-grounded FET $M_{29}$ whose gate is connected to the gates of the FETs $M_{15}$ and $M_{16}$.

As seen from the above explanation, a zero point compensation circuit is formed by a closed loop starting from the drain of the FET $M_{18}$ and extending through the capacitor $C_c$ and the drain-source path of the gate-grounded FET $M_{20}$ to the gate of the FET $M_{18}$.

Figure 5:
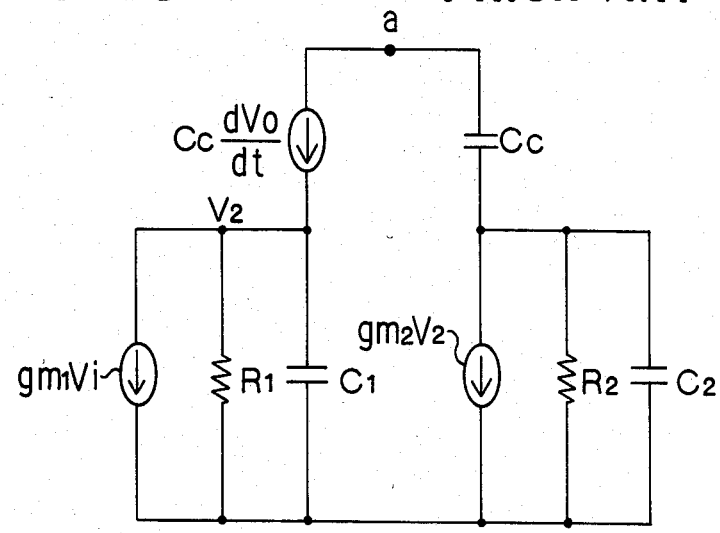
FIGS. 5 and 6 are equivalent circuit diagrams of the amplifier shown in FIG. 4.

In the B. K. Ahiya paper, a small-signal equivalent circuit shown in FIG. 5 was introduced from the operational amplifier shown in FIG. 4. In the equivalent circuit of FIG. 5, $g_{m1}$ and $g_{m2}$ represent the transconductances of the initial stage FET and the second stage FET, respectively. $R_1$ and $C_1$ designate output resistance and capacitance of the initial stage, and $R_2$ and $C_2$ show output resistance and capacitance of the second stage. $V_i$ and $V_o$ are input and output voltages, respectively. In addition, since one electrode "a" of the phase compensating capacitor $C_c$ is connected to the source of the gate-grounded FET $M_{20}$ in the operational amplifier shown in FIG. 4, the electrode terminal "a" becomes a virtual ground point. Further, all the current flowing through the phase compensating capacitor $C_c$ is flowed into the output terminal of the initial stage.

Thus, the current flowing from the output terminal of the initial stage through the phase compensating capacitor $C_c$ to the output terminal of the second stage is canceled by the above current, so that the generation of a zero-point is prevented. Further, since the output terminal of the second stage is connected through the phase compensating capacitor to a low impedance point such as one terminal of the FET $M_{20}$, an excellent SVRR can be obtained.

Figure 6:
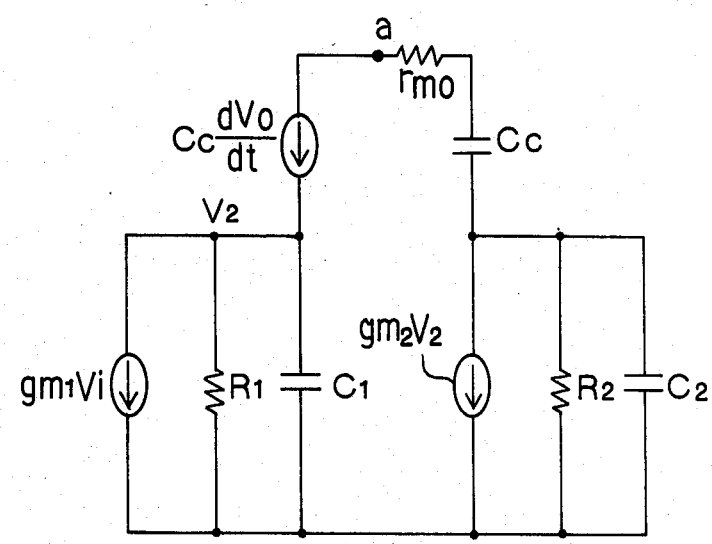

In the circuit analysis as mentioned above, such an ideal case is assumed that the source of the gate-grounded FET $M_{20}$ is virtually grounded. In fact, however, the voltage at the source of the FET $M_{20}$ will fluctuate dependently upon variation in voltage at the output terminal of the second stage. The reason for this is that the source of the FET $M_{20}$ is actually connected to the ground point through a resistive component $r_{m0}$ which is an inverted value of the transconductance $g_{m0}$ of the FET $M_{20}$. Therefore, the small-signal equivalent circuit of the FIG. 4 operational amplifier should be corrected as shown in FIG. 6.

In the equivalent circuit shown in FIG. 6, the closed loop gain $V_o/V_i$ to frequency S can be expressed as follows:

$$\frac{V_o}{V_i} = \frac{-A_1 A_2 (1 + S\, r_{m0} C_c)}{1 + bS + cS^2 + dS^3} \quad (1)$$

where $V_i$ is an input voltage $V_o$ is an output voltage $A_1 = g_{m1} R_1$, $A_2 = g_{m2} R_2$ $b = R_1 C_1 + R_2 C_2 + R_2 C_c + r_{m0} C_c + A_2 R_1 C_c$ $c = R_1 R_2 C_1 (C_c + C_2) + r_{m0} R_2 C_2 C_c$ $d = r_{m0} R_1 R_2 C_1 C_2 C_c$ As seen from the above equation (1), the operational amplifier of FIG. 4 has one zero point Z at the frequency $S_z = -g_{m0}/C_c$. Therefore, in order to avoid the adverse effect of this zero point, it is necessary to increase the transconductance $g_{m0}$ of the FET $M_{20}$. For this purpose, either the current flowing through the FET $M_{20}$ has to be increased, or the dimension of the FET $M_{20}$ must be considerably enlarged. However, these methods will cause another problem such as increase of consumed power or chip size. In a typical example, the necessary transconductance was 1 mS. For obtaining such a transconductance, the current of 1.5 mA must flow through the FET $M_{20}$, or the FET $M_{20}$ has to have the channel width to length ratio W/L of about 200.

Figure 7:
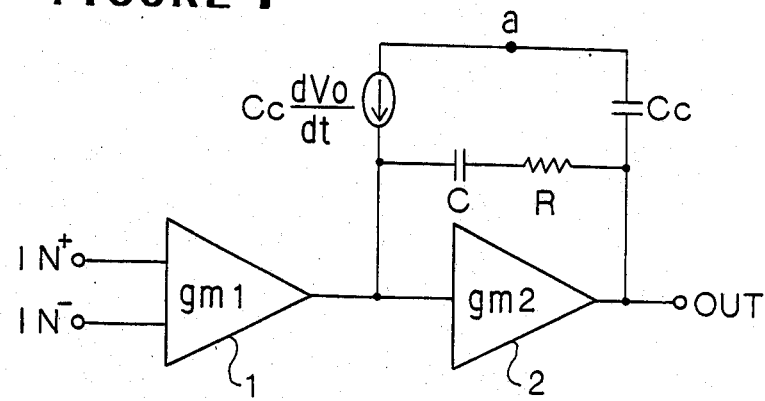
FIG. 7 is a fundamental circuit diagram illustrating the principle of the operational amplifier in accordance with the present invention.

Turning to FIG. 7, there is shown a basic circuit diagram of the operational amplifier in accordance with the present invention. The shown operational amplifier comprises a two-input initial amplifier 1 having the transconductance $g_{m1}$, whose output is connected to a second or output amplifier 2 having the transconductance $g_{m2}$. Further, a capacitor C and a resistor R are series-connected between the outputs of the initial and second amplifiers 1 and 2, in addition to a feedback path consisting of a phase compensating capacitor $C_c$, a virtual ground point "a" and a feedback current source supplying a current of $C_c (dV_0/dt)$.

Figure 8:
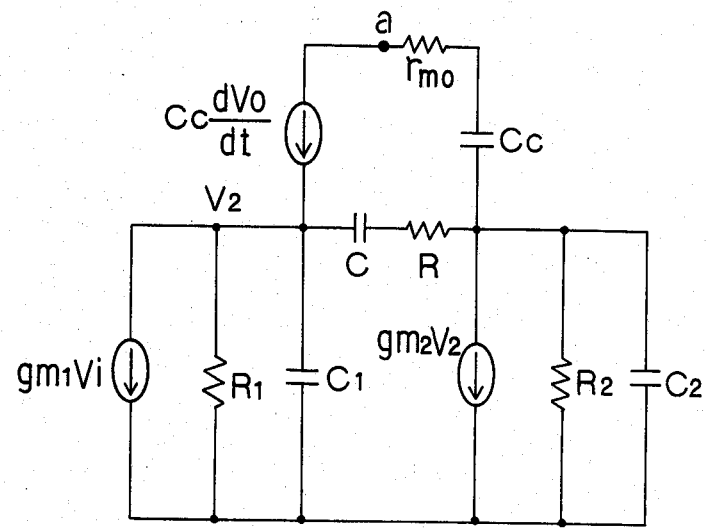
FIGS. 8 and 9 are a small-signal equivalent circuit diagrams of the amplifier shown in FIG. 7.

A small-signal equivalent circuit of the operational amplifier shown in FIG. 7 can be expressed as shown in FIG. 8, in which $g_{m1}$ and $g_{m2}$ represent the transconductances of the initial stage FET and the second stage FET, respectively; $R_1$ and $C_1$ designate output resistance and capacitance of the initial stage; $R_2$ and $R_c$ show output resistance and capacitance of the second stage; $r_{m0}$ is a resistive component between the virtual ground point "a" and the phase compensating capacitor $C_c$; and $V_i$ and $V_o$ and input and output voltages, respectively.

On the basis of the equivalent circuit of FIG. 8, the closed loop gain of the operational amplifier shown in FIG. 7 can be expressed:

$$\frac{V_o}{V_i} = \frac{g_{m1} g_{m2} R_1 R_2 \left(1 - S\left(\frac{C}{g_{m2}} - RC\right)\right)(1 + S\, r_{m0} C_c)}{1 + bS + cS^2 + dS^3 + eS^4} \quad (2)$$

where

S is a frequency, $b = R_1(C_1 + C) + R_2(C_2 + C + C_c)$
$\quad + g_{m2} R_1 R_2 (C + C_c) + r_{m0} C_c + RC$ $c = R_1 R_2 (C_1 C_2 + C_1 C_c + C_1 C + C_2 C) + r_{m0} R_2 C_c (C_2 + C)$
$\quad + RC(R_1 C_1 + R_2 C_2 + R_2 C_c) g_{m2} R_1 R_2 RCC_c$ $d = r_{m0} R_1 R_2 C_c (C_1 C_2 + C_1 C + C_2 C) + R_1 R_2 RC_1 C(C_2 + C_c)$
$\quad + r_{m0} R_2 C_c C(R_1 C_1 + R_2 C_2)$ $e = r_{m0} R_1 R_2 RC_1 C_2 CC_c$ As is apparent from the above equation (2), the operational amplifier of FIG. 7 has two zero points $Z_1$ and $Z_2$ at frequencies $S_{z1}$ and $S_{z2}$, respectively, which are expressed as follows:

$$S_{z1} = \left(\frac{C}{g_{m2}} - RC\right)^{-1} \quad (3)$$

$$S_{z2} = -\frac{1}{r_{m0} C_c} = -\frac{g_{m0}}{C_c} \quad (4)$$

In addition, first and second poles $P_1$ and $P_2$ appear at frequencies $S_{p1}$ and $S_{p2}$, respectively, which are also expressed:

$$S_{p1} = \frac{-1}{R_2(1 + g_{m2} R_1)(C + C_c)} \quad (5)$$

$$S_{p2} = \frac{-g_{m2}(C + C_c)}{C_1 C_c + (C_1 + C_2)C + RCC_c\left(\frac{1}{R_1} + g_{m2}\right)} \quad (6)$$

Examining the equations (3) to (6), if the resistor R and the transconductance $g_{m0}$ are set at suitable values, even if any circuit constants are given for a desired characteristics, the zero point $Z_1$ can be shifted to an infinite frequency and also the frequency $S_{z2}$ of the second zero point $Z_2$ can be shifted to be consistent with the frequency $S_{p2}$ of the second pole $P_2$. If such a shift of the zero points is possible, the adverse effect of the zero points can be perfectly eliminated without increase in consumed power or chip size.

For example, assuming $g_{m2} = 5$ μS, $C_1 = 0.5$ pF, $C_2 = 1.0$ pF, $C = 3$ pF, $C_c = 20$ pF, $R_1 = 10$MΩ, $R_2 = 5$MΩ, $g_{m0} = 30$ μS, and $R = 200$KΩ, there are obtained $S_{z1} = \infty$ Hz, $S_{z2} = 1.5$ MKz and $S_{p2} = 1.5$ MHz. In addition, the closed loop gain $V_0/V_i$ can be expressed:

$$\frac{V_o}{V_i} = \frac{A_1 A_2}{(S + P_1)(S + P_3)(S + P_4)} \quad (7)$$

Incidentally, the frequency $S_{p1}$ of the first pole $P_1$ is 170 Hz, and third and fourth poles $P_3$ and $P_4$ are positioned at such a very high frequencies that cannot have a substantial influence to the operational amplifier.

Figure 9:
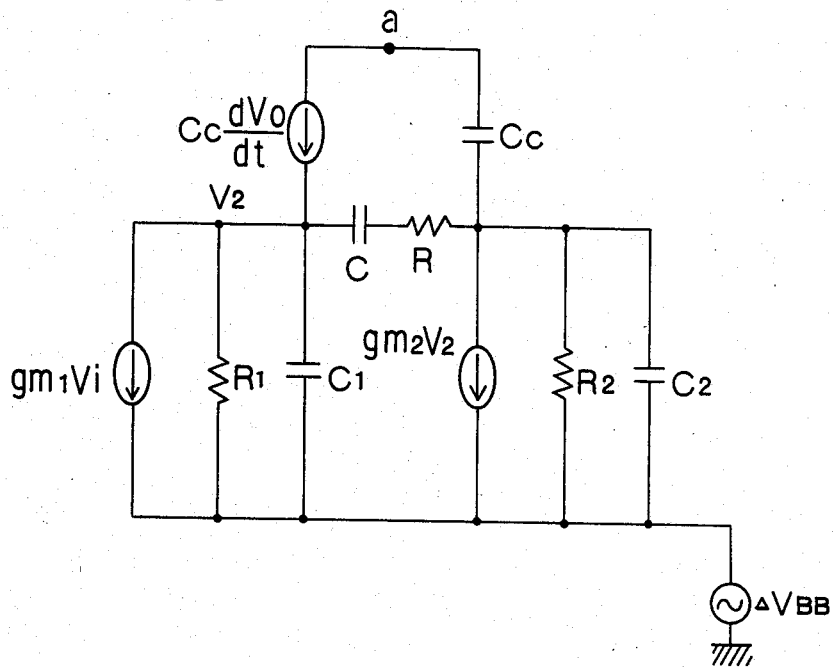

Next, the SVRR will be reviewed. In this case, even if the resistive component $r_{m0}$ between the virtual ground point "a" and the phase compensating capacitor $C_c$ is neglected, the generality of the equivalent circuit is not lost. Therefore, examination will be made on the basis of another equivalent circuit shown in FIG. 9, in which the same elements as those shown in FIG. 8 are given the same Reference signs.

Under this condition, the ratio of a variation $\Delta V_0$ in the output voltage $V_0$ of the second amplifier 2 to a negative supply voltage variation $\Delta V_{BB}$ can be expressed as follows:

$$\frac{\Delta V_o}{\Delta V_{BB}} = \frac{(1 - g_{m2}R_2) + b'S + C'S^2 + d'S^3}{1 + bS + cS^2 + dS^3} \quad (8)$$

where $b = R_1(C_1+C) + R_2(C_2+C+C_c) + g_{m2}R_1R_2(C+C_c) + RC$ $c = R_1R_2(C_1C_2 + C_1C_c + C_1C + C_2C)$
  $+ RC(R_1C_1 + R_2C_2 + R_2C_c) + g_{m2}R_1R_2RCC_c$ $d = R_1R_2RC_1C(C_2+C_c)$ $b' = R_1(C_1+C) + R_2(C_2+C) - g_{m2}R_2(RC+R_1C_1) + RC$ $c' = R_1R_2(C_1C_2 + C_1C + C_2C)$
  $+ RC(R_1C_1 + R_2C_2) - g_{m2}R_1R_2RCC_1$ $d' = R_1R_2RC_1C_2C$ Therefore, the SVRR can be expressed:

$$SVRR = \frac{\Delta V_o}{\Delta V_{BB}} \cdot \frac{1}{1 + \frac{V_o}{V_i}} \quad (9)$$

$$= \frac{1}{A_1A_2}((1 - g_{m2}R_2)\,b'S + c'S^2 + d'S^3)$$

Furthermore, it can be said from the equation (9) that the SVRR has a substantially flat characteristics within a range from 0 Hz to a frequency f(Hz) which can be expressed:

$$f = \frac{1}{R_1C_1 + RC} \quad (10)$$

Therefore, if the above-mentioned circuit constants are given, the frequency f becomes 180 KHz. Namely, the SVRR is improved by three figures in respect to the first pole frequency $S_{p1}$ of 170 Hz.

The above analysis is directed to the SVRR against to the negative power supply voltage, but a similar result can be also obtained in respect to the SVRR against the positive supply voltage.

Figure 10:
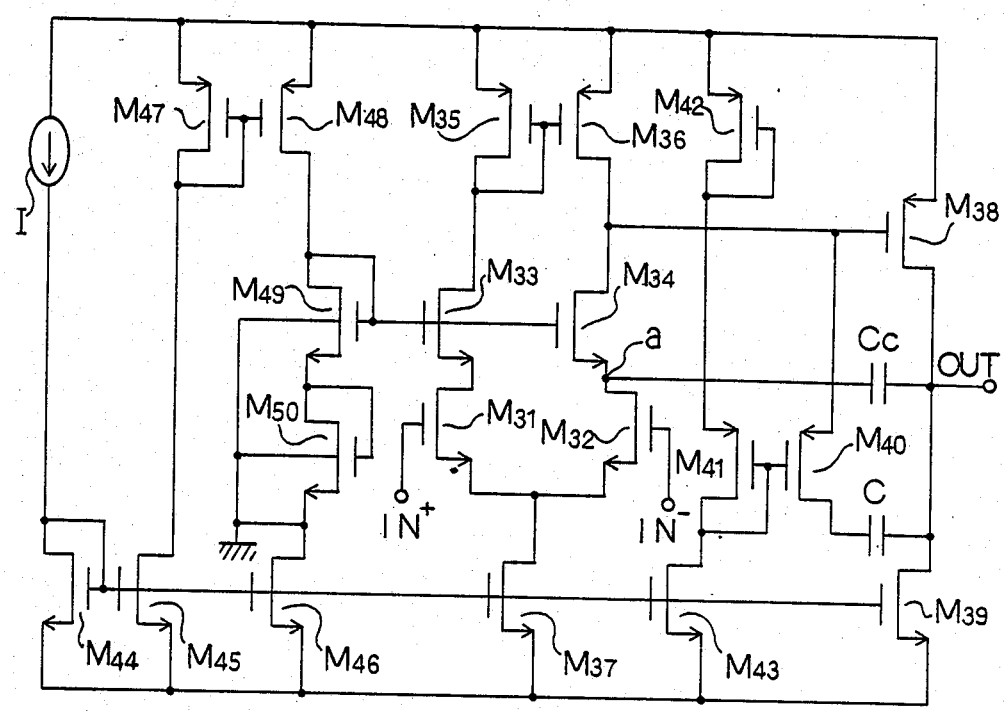
FIG. 10 is a circuit diagram showing one embodiment of the operational amplifier in accordance with the present invention.

Referring to FIG. 10, there is shown a circuit diagram of an operational amplifier embodying the aforementioned principle in accordance with the present invention.

The shown operational amplifier includes an initial stage constituted of a pair of input n-channel FETs $M_{31}$ and $M_{32}$ connected in the form of a differential circuit. A gate of the FET $M_{31}$ forms one input, for example, a non-inverted input of the operational amplifier, and a gate of the other FET $M_{32}$ constitutes the other input, for example, an inverted input of the amplifier. The pair of input FETs $M_{31}$ and $M_{32}$ have their drains connected to a positive supply voltage through n-channel FETs $M_{33}$ and $M_{34}$ and p-channel FETs $M_{35}$ and $M_{36}$, respectively. The FETs $M_{33}$ and $M_{34}$ constitute constant current source, as will be explained hereinafter. The FET $M_{35}$ and $M_{36}$ are connected to form an active load in the type of a current mirror circuit. Sources of the FETs $M_{31}$ and $M_{32}$ are common-connected to a drain of an n-channel FET $M_{37}$, which is connected at its source to a negative supply voltage so as to function as a constant current source.

The connection between the FETs $M_{34}$ and $M_{36}$ is connected to a gate of an output p-channel FET $M_{38}$ which constitutes a second or output stage of the operational amplifier. This FET $M_{38}$ is connected at its source to the positive supply voltage and at its drain to the negative supply voltage through an n-channel FET $M_{39}$ which functions as an active load in the form of a constant current source explained hereinafter. In addition, the drain of the FET $M_{38}$ is connected to an output of the operational amplifier, and also connected through a phase compensation feedback capacitor $C_c$ to the drain of the input FET $M_{32}$.

Further, the drain of the FET $M_{38}$ is connected through another capacitor C and a p-channel FET $M_{40}$ to the gate of the FET $M_{38}$ itself. A gate of the FET $M_{40}$ is connected to a gate and a drain of a p-channel FET $M_{41}$. A source of the FET $M_{41}$ is connected to a drain and a gate of a p-channel FET $M_{42}$ whose source is connected to the positive voltage source. The drain of the FET $M_{41}$ is connected to the negative voltage source through an n-channel FET $M_{43}$. Thus, as seen from the above, since the FET $M_{41}$ and $M_{42}$ function as resistors, respectively, and since the FET $M_{43}$ constitutes a constant current source as will be explained hereinafter, the FET $M_{41}$, $M_{42}$ and $M_{43}$ form a bias circuit determining the gate voltage of the FET $M_{40}$. Therefore, the FET $M_{40}$ operates as a resistive element.

A constant current source I and an n-channel FET $M_{44}$ are connected in series across the supply voltages. The FET $M_{44}$ has a gate thereof connected to the drain of FET $M_{44}$ itself and also connected to gates of n-channel FETs $M_{45}$ and $M_{46}$ and the FETs $M_{37}$, $M_{43}$ and $M_{39}$, so that the FET $M_{40}$ constitutes an input path of a current mirror circuit and the FETs $M_{45}$, $M_{46}$ $M_{37}$, $M_{43}$ and $M_{39}$ form different output paths of the current mirror circuit, respectively, which function constant current sources.

In addition, the FET $M_{45}$ has a drain thereof connected to a gate and a drain of a p-channel FET $M_{47}$, whose source is connected to the positive supply voltage. This FET $M_{47}$ has its gate connected to a gate of another p-channel FET $M_{48}$ so as to form a current mirror circuit. The FET $M_{48}$ is connected at its drain to the drain of the FET $M_{46}$ through two series-connected n-channel FETs $M_{49}$ and $M_{50}$. These FETs are short-circuited between their gate and drain so as to function as a resistive element. The gate of the FET $M_{49}$ is connected to the gates of the FETs $M_{33}$ and $M_{34}$. Thus, the FETs $M_{45}$, $M_{46}$, $M_{47}$, $M_{48}$, $M_{49}$ and $M_{50}$ form a bias circuit providing a constant gate voltage to the FETs $M_{33}$ and $M_{34}$. Therefore, the FETs $M_{33}$ and $M_{34}$ function as constant current sources.

In the operational amplifier as mentioned above, the virtual ground point "a" is provided at the connection between the FETs $M_{32}$ and $M_{34}$. The sources of the two FETs $M_{33}$ and $M_{34}$ are connected to the virtual ground point "a" through the resistive components $1/g_{m0}$ of the FETs $M_{33}$ and $M_{34}$ having the transconductance $g_{m0}$. However, the adverse effect of the zero point caused by the resistive component $1/g_{m0}$ of the FETs $M_{33}$ and $M_{34}$ is canceled by the second pole made shiftable by the FET $M_{40}$.

Since this FET $M_{40}$ is connected in series to the capacitor C, no current will flow through the FET $M_{40}$. In this connection, the gate bias circuit is provided for the FET $M_{40}$, but the comsumed current in the bias circuit is on the order of several ten microamperes. In addition, it is sufficient if the FETs $M_{33}$ and $M_{34}$ generating the zero point which should be canceled by the second pole produced by the FET $M_{40}$, has the channel width to length ratio W/L of at least about 10. This means that the current flowing through these FETs is on the order of several ten microamperes.

As seen from the above description, in the present invention, a resistive element and a capacitive element are series-connected between the outputs of the initial and second stages. With this circuit arrangement, the operational amplifier can have an excellent SVRR and phase compensation characteristics with only a small consumed power and required element size.

The invention has thus been shown and described with reference to specific embodiments. However, it should be noted that the invention is in no way limited to the details of the illustrated structures but changes and modifications may be made within the scope of the appended claims.

I claim:

1. An operational amplifier which comprises an initial amplifier stage having a pair of inputs, a second amplifier stage connected to an output of the initial stage, a phase compensating capacitive element connected between an output terminal of the second stage and a virtual ground point, and a constant current source connected to the virtual ground point and the output of the initial stage, wherein the improvement comprises a resistive element and a second capacitive element series-connected between the output of the initial stage and the output of the second stage.

2. An operational amplifier as claimed in claim 1 wherein the resistive element is a field effect transistor and the capacitive element is a capacitor.

3. An operational amplifier as claimed in claim 1 wherein the initial amplifying stage includes first and second field effect transistors connected in the form of a differential circuit, the gates of the field effect transistors forming the pair of inputs, the field effect transistors having their sources common-connected to a first constant current source circuit which is connected to negative supply voltage, and the field effect transistors having their drains respectively connected through a pair of second constant current source circuits and a pair of first active loads to a positive supply voltage, the connection between one of the second constant current source circuits and the first active load connected in series thereto being connected to the input of the second amplifier stage, the one second constant current source circuit constituting the above mentioned constant current source.

4. An operational amplifier as claimed in claim 3, wherein the phase compensating capacitive element is a capacitor connected between the output of the second amplifier stage and the one end of the above mentioned one second constant source circuit which is connected at its opposite end to the input of the second amplifier stage.

5. An operational amplifier as claimed in claim 4 wherein the second amplifier stage includes a third field effect transistor having its gate connected to the connection between the above mentioned one second constant current source and the first active load connected in series thereto, the third field effect transistor being connected at its source to the positive supply voltage and at its drain through a third constant current source to the negative supply voltage, the resistive element and the second capacitive element being connected in series between the gate and the source of the third field transistor.

6. An operational amplifier as claimed in claim 5 wherein the resistive element is a fourth field effect transistor having a drain-source path connected in series to the second capacitive element, the gate of the fourth field effect transistor being connected to a first gate bias circuit.

7. An operational amplifier as claimed in claim 6 wherein the first gate bias circuit includes two resistors and a fourth constant current source circuit which are connected in series between the positive and negative supply voltages, the connection between the fourth constant current source circuit and one of the two resistors being connected to the gate of the fourth field effect transistor.

8. An operational amplifier as claimed in claim 7 wherein each of the two resistors is a field effect transistor having gate and drain common-connected to function as a resistor.

9. An operational amplifier as claimed in claim 7 wherein each of the second constant current source circuits is formed of a fifth field effect transistor having a drain-source path connected between the corresponding one of the first and second field effect transistors and the associated first active load, the pair of the fifth field effect transistors having their gates common-connected to a second gate bias circuit.

10. An operational amplifier as claimed in claim 9 wherein the second gate bias circuit includes a fifth constant current source circuit, two resistors and a sixth constant current source circuit which are connected in series in the named order between the positive and negative supply voltages, the connection between the fifth constant current source circuit and one of the two resistors being connected to the gates of the fifth field effect transistors.

11. An operational amplifier as claimed in claim 10 wherein each of the two resistors in the second gate bias circuit is a field effect transistor having gate and drain common-connected to function as a resistor.

12. An operational amplifier as claimed in claim 10 further including a main constant current source and a sixth field effect transistor connected in series between the positive and negative supply voltages, the sixth field effect transistor having common-connected gate and drain, and wherein each of the first, third, fourth and sixth constant current source circuits are a field effect transistor having a gate connected to the gate of the sixth field effect transistor.

13. An operational amplifier as claimed in claim 12 further including seventh and eighth field effect transistors connected in series between the positive and negative supply voltages, the seventh field effect transistor having a gate connected to the gate of the sixth field effect transistor, and wherein the fifth constant current source is a ninth field effect transistor having a gate connected to the gate and drain of the eighth field effect transistors so that the eighth and ninth field effect transistors form a current mirror circuit.

14. An operational amplifier comprising:
first and second field effect transistors connected in the form of a differential circuit and having gates thereof forming a pair of inputs, the field effect transistors having their sources common-connected to a first constant current source which is connected to a negative supply voltage, and the field effect transistors having their drains respectively connected through a pair of second constant current sources and a pair of first active loads to a positive supply voltage;

a third field effect transistor having its gate connected to the connection between one of the second constant current sources and the first active load connected in series thereto, the third field effect transistor being connected at its source to the positive supply voltage and at its drain through a third constant current source to the negative supply voltage;

a phase compensating capacitor connected between the drain of the third field effect transistor and the one end of the above mentioned one second constant current source which is connected at its opposite end to the gate of the third field effect transistor; and a resistor and a second capacitor connected in series between the gate and the drain of the third field transistor.

15. An operational amplifier as claimed in claim 14 wherein the resistor is formed of a fourth field effect transistor having a drain-source path connected in series to the second capacitor, the gate of the fourth field effect transistor being connected to a first gate bias circuit.

16. An operational amplifier as claimed in claim 15 wherein the first gate bias circuit includes two resistors and a fourth constant current source which are connected in series between the positive and negative supply voltages, the connection between the fourth constant current source and one of the two resistors being connected to the gate of the fourth field effect transistor.

17. An operational amplifier as claimed in claim 16 wherein each of the two resistors is a field effect transistor having gate and drain common-connected to function as a resistor.

18. An operational amplifier as claimed in claim 16 wherein each of the second constant current sources is formed of a fifth field effect transistor having a drain-source path connected between the corresponding one of the first and second field effect transistors and the associated first active load, the pair of the fifth field effect transistors having their gates common-connected to a second gate bias circuit.

19. An operational amplifier as claimed in claim 18 wherein the second gate bias circuit includes a fifth constant current source, two resistors and a sixth constant current source which are connected in series in the named order between the positive and negative supply voltages, the connection between the fifth constant current source and one of the two resistors being connected to the gates of the fifth field effect transistors.

20. An operational amplifier as claimed in claim 19 wherein each of the two resistors in the second gate bias circuit is a field effect transistor having gate and drain common-connected to function as a resistor.

21. An operational amplifier as claimed in claim 19 further including a main constant current source and a sixth field effect transistor connected in series between the positive and negative supply voltages, the sixth field effect transistor having common-connected gate and drain, and wherein each of the first, third, fourth and sixth constant current sources are a field effect transistor having a gate connected to the gate of the sixth field effect transistor.

22. An operational amplifier as claimed in claim 21 further including seventh and eighth field effect transistors connected in series between the positive and negative supply voltages, the seventh field effect transistor having a gate connected to the gate of the sixth field effect transistor, and wherein the fifth constant current source is a ninth field effect transistor having a gate connected to the gate and drain of the eighth field effect transistor so that the eighth and ninth field effect transistors form a current mirror circuit.

* * * * *

UNITED STATES PATENT AND TRADEMARK OFFICE
CERTIFICATE OF CORRECTION

PATENT NO. : 4,661,779
DATED : T. OKAMOTO
INVENTOR(S) : April 28, 1987

It is certified that error appears in the above-identified patent and that said Letters Patent is hereby corrected as shown below:

COLUMN 1, LINE 41  Delete "comsuption" insert --consumption--;

COLUMN 1, LINE 57  Delete "comsuption" insert --consumption--;

COLUMN 3, LINE 28  Delete "flactuation" insert --fluctuation--.

COLUMN 9, LINE 67  Delete "source" and insert --drain--.

Signed and Sealed this

Twelfth Day of July, 1988

*Attest:*

DONALD J. QUIGG

*Attesting Officer*   *Commissioner of Patents and Trademarks*